(12) United States Patent
Maillard et al.

(10) Patent No.: US 10,958,067 B2
(45) Date of Patent: Mar. 23, 2021

(54) SINGLE EVENT LATCH-UP (SEL) MITIGATION DETECT AND MITIGATION

(71) Applicant: Xilinx, Inc., San Jose, CA (US)

(72) Inventors: Pierre Maillard, Campbell, CA (US); Yanran Chen, San Jose, CA (US); Michael J. Hart, Palo Alto, CA (US)

(73) Assignee: XILINX, INC., San Jose, CA (US)

(*) Notice: Subject to any disclaimer, the term of this patent is extended or adjusted under 35 U.S.C. 154(b) by 296 days.

(21) Appl. No.: 16/136,104

(22) Filed: Sep. 19, 2018

(65) Prior Publication Data
US 2020/0091713 A1    Mar. 19, 2020

(51) Int. Cl.
*H02H 9/04* (2006.01)
*H03K 17/693* (2006.01)
*H02H 5/00* (2006.01)

(52) U.S. Cl.
CPC .......... *H02H 9/046* (2013.01); *H02H 5/005* (2013.01); *H03K 17/693* (2013.01)

(58) Field of Classification Search
CPC .......... H02H 9/00; H02H 9/02; H02H 9/025; H02H 9/026; H02H 9/04; H02H 9/041–046; H02H 9/048; H03K 17/08; H03K 17/693
See application file for complete search history.

(56) References Cited

U.S. PATENT DOCUMENTS

| | | |
|---|---|---|
| 4,731,691 A | 3/1988 | Padwa |
| 5,235,215 A | 8/1993 | Davies et al. |
| 7,929,263 B1 | 4/2011 | Peachey et al. |
| 2004/0201033 A1* | 10/2004 | Russ ............... H01L 29/87 257/107 |
| 2005/0213274 A1* | 9/2005 | Wu ............... H01L 27/0262 361/91.1 |
| 2009/0122452 A1* | 5/2009 | Okushima ........... H01L 27/0262 361/56 |
| 2014/0027810 A1* | 1/2014 | Yang ................. H01L 27/0921 257/133 |

OTHER PUBLICATIONS

Karp, James, et al, "Single-Event Latch-Up: Increased Sensitivity From Planar to FinFET", IEEE Trans. Nucl. Sci., vol. 65, issue 1, pp. 217-222, Jan. 2018.
U.S. Appl. No. 16/110,894, filed Aug. 23, 2018, Hart, Michael J. et al., San Jose, CA USA.

* cited by examiner

*Primary Examiner* — Fred E Finch, III
*Assistant Examiner* — Kevin H Sprenger
(74) *Attorney, Agent, or Firm* — Patterson + Sheridan, LLP

(57) ABSTRACT

An integrated circuit (IC) chip having circuitry adapted to detect and unlatch a latched transistor, and methods for operating the same are provided. In one example, an IC chip includes a body, a power rail disposed in the body and coupled to at least one of a plurality of contact pads disposed on the body, and a first core circuit disposed in the body. The first core circuit includes a first current limiting circuit, a silicon controlled rectifier (SCR) device having a first transistor, a second transistor, and a first latch sensing circuit. The first current limiting circuit is coupled to the power rail. First terminals of the first and second transistors are coupled to the first current limiting circuit. The first latch sensing circuit has a first input terminal coupled to second terminals of the first and second transistors. The first latch sensing circuit also has an output terminal coupled to the first current limiting circuit.

20 Claims, 4 Drawing Sheets

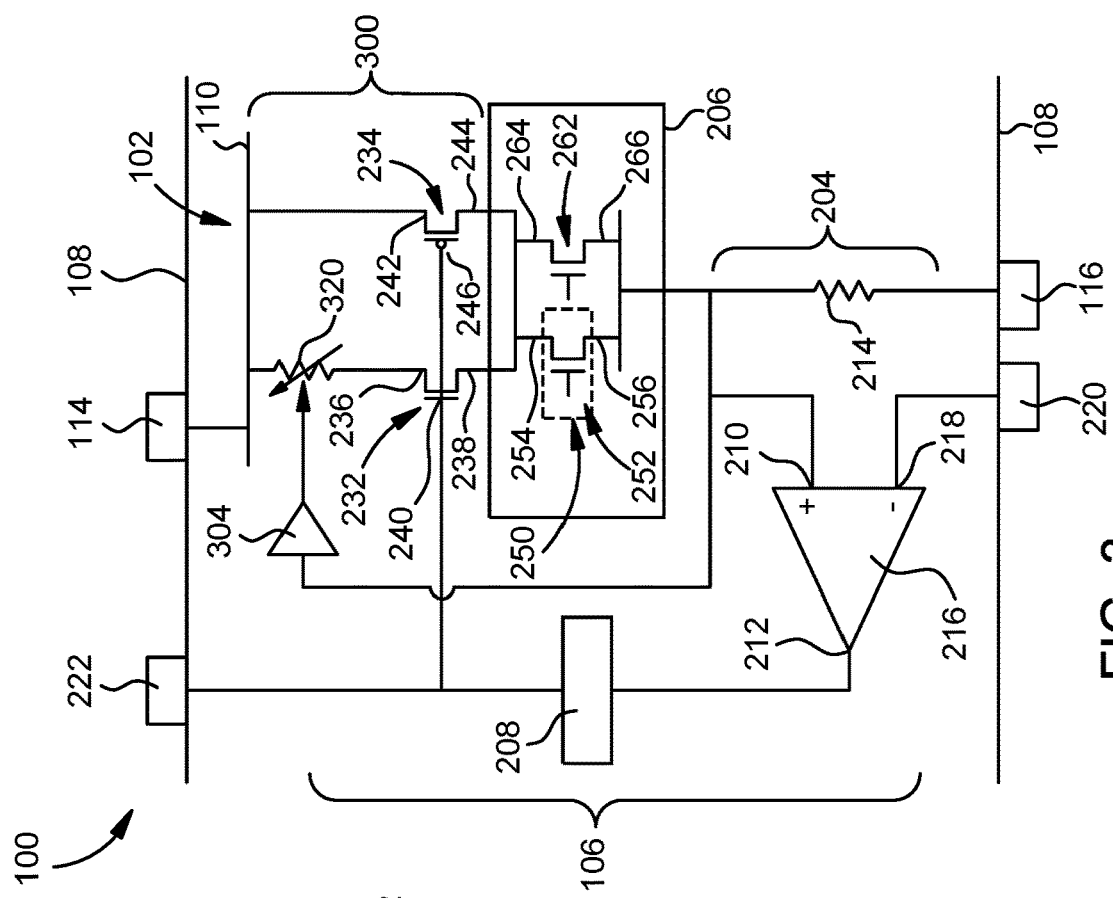
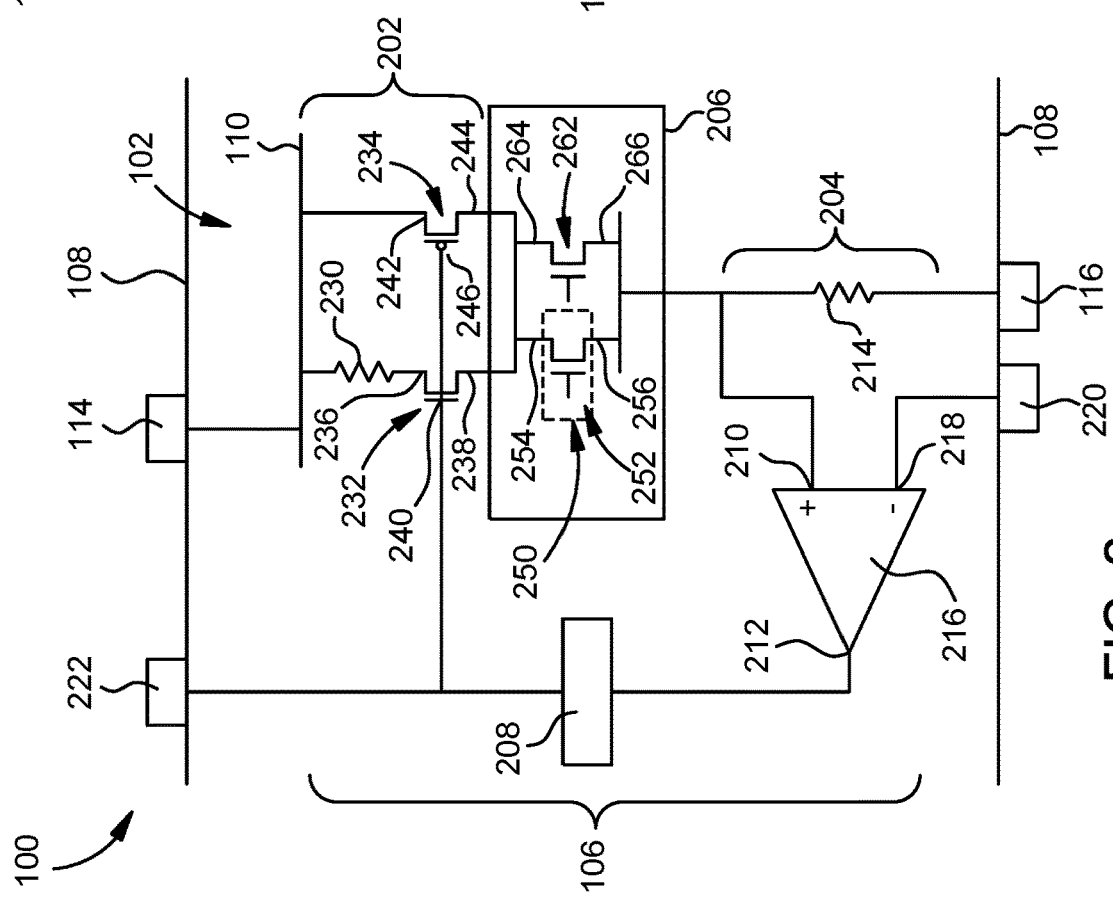
FIG. 3
FIG. 2

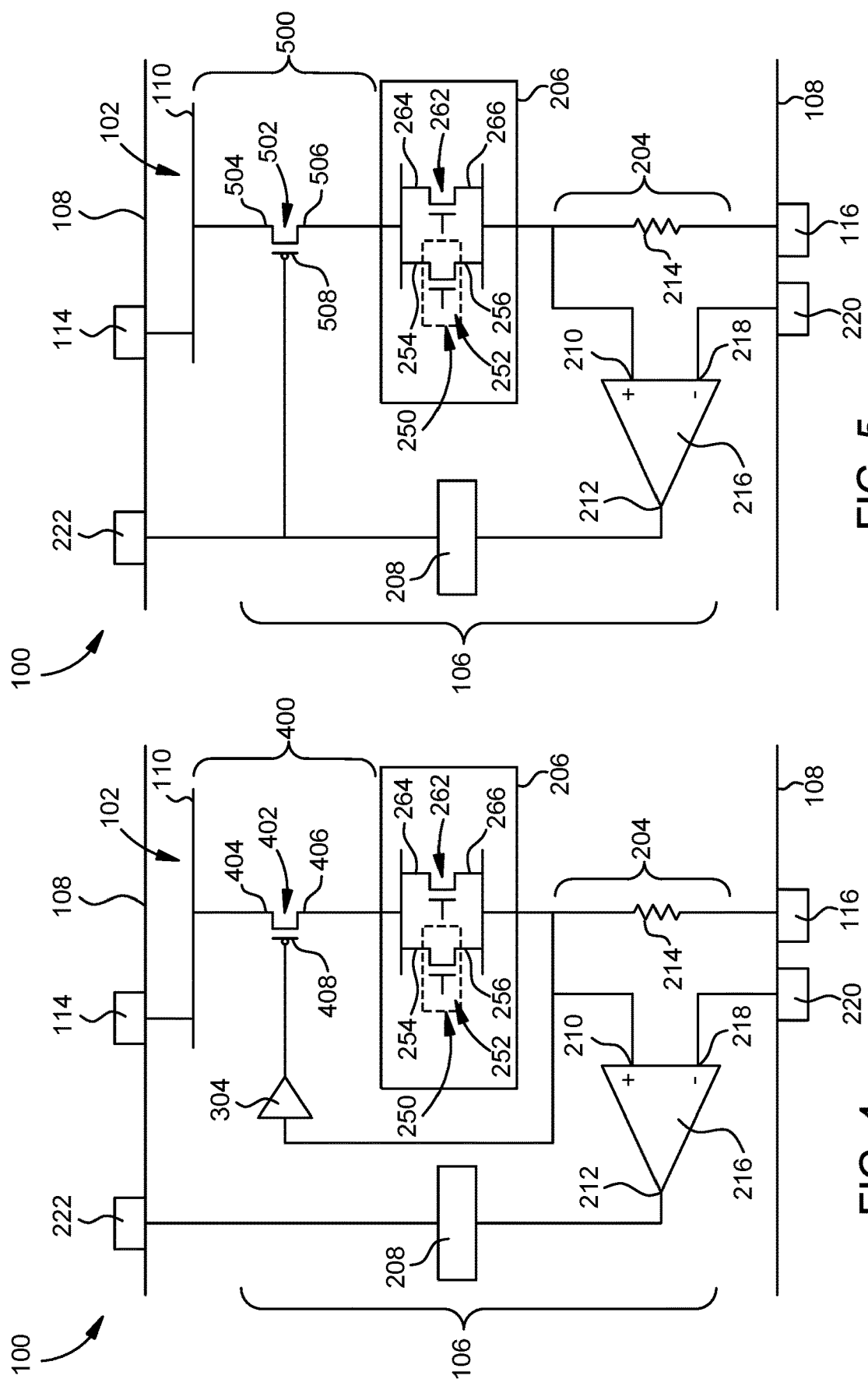

SINGLE EVENT LATCH-UP (SEL) MITIGATION DETECT AND MITIGATION

TECHNICAL FIELD

Examples of the present disclosure generally relate to integrated circuits and, in particular, to mitigation of single event latch-up (SEL) on integrated circuits.

BACKGROUND

Single event latch-up (SEL) is generally an abnormal high-current state in a device caused by the passage of an energetic particle through sensitive regions of the device structure. SEL can result in the loss of device functionality. In complementary device structures in integrated circuits (such as in complementary metal-oxide-semiconductor (CMOS) structures), SEL can result in a parasitic silicon controlled rectifier (SCR) structure turning on to conduct a current. When the parasitic SCR structure is turned on, a voltage drop across the parasitic SCR structure can result in the parasitic SCR structure continuing to conduct the current. The continuous conduction of the current can damage the integrated circuit, such as by generating heat that can cause melting of components, migration of metal, or other problems.

The conventional approach for un-latching transistors in an integrated circuit (IC) die experiencing an SEL event is to reduce voltage applied across the SCR structure to a voltage low enough such that the latch-up can no longer be sustained and the high current disappear. The voltage applied across the SCR structure is typically reduced by removing power applied to the die or switching off the supply power within the IC die. However, removing power from the IC die causes the IC die to loose functionality until the power is restored. Additionally, memory states may be lost when the die is powered off.

Thus, there is a need for an improved structure and methodology for detecting and mitigating SEL events on integrated circuits.

SUMMARY

An integrated circuit (IC) chip having circuitry adapted to detect and unlatch a latched silicon controlled rectifier (SCR) device, and methods for operating the same are provided. In one example, an IC chip includes a body having a plurality of contact pads, a power rail disposed in the body and coupled to at least one of the plurality of contact pads, and a first core circuit disposed in the body. The first core circuit includes a first current limiting circuit, a first and second transistor, and a first latch sensing circuit. The first current limiting circuit is coupled to the power rail. The first transistor is part of a silicon controlled rectifier (SCR) device and has a first terminal and a second terminal. The first terminal of the first transistor is coupled to the first current limiting circuit. The second transistor has a first terminal and a second terminal. The first terminal of the second transistor is coupled to the first current limiting circuit. The first latch sensing circuit has a first input terminal coupled to the first terminals of the first and second transistors. The first latch sensing circuit also has an output terminal coupled to the first current limiting circuit.

In another example, an IC chip includes a body having a plurality of contact pads. Disposed in the body are a power rail, first and second transistors, a first latch sensing circuit and a first current limiting circuit. The power rail is coupled to at least one of the plurality of contact pads. The first transistor silicon controlled rectifier (SCR) device and has a first terminal and a second terminal. The first terminal of the first transistor is coupled to the power rail. The second transistor has a first terminal and a second terminal. The first terminal of the second transistor coupled to the power rail. The first latch sensing circuit is configured to output a first signal in response to the first and second transistors operating in a normal condition. The first latch sensing circuit is also configured to output a second signal in response to at least one of the first and second transistors operating in a latched condition. The first current limiting circuit couples the first and second transistors to the power rail. The first current limiting circuit is configured to limit current to reduce current passing from the power rail to the first and second transistors in response to a signal being received from the first latch sensing circuit switching from the first signal to the second signal.

In yet another example, a method for operating an integrated circuit chip is provided. The method includes detecting a latch state of a silicon controlled rectifier (SCR) device having in a first transistor coupled to a power rail having a supply voltage, and reducing current supplied to the SCR device coupled to the power rail without reducing the supply voltage. The method may optionally include reducing current supplied to the SCR device to an amount sufficient to unlatch the SCR device, wherein the amount of current is sufficient to maintain operation of a second transistor coupled to the power rail. The method may also optionally include increasing a resistance of a circuit coupling the SCR device to the power rail.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 2-5 are schematic diagrams for different examples of the core circuit of FIG. 1 detailing various examples of SEL detection and mitigation circuitry.

Figure 1:
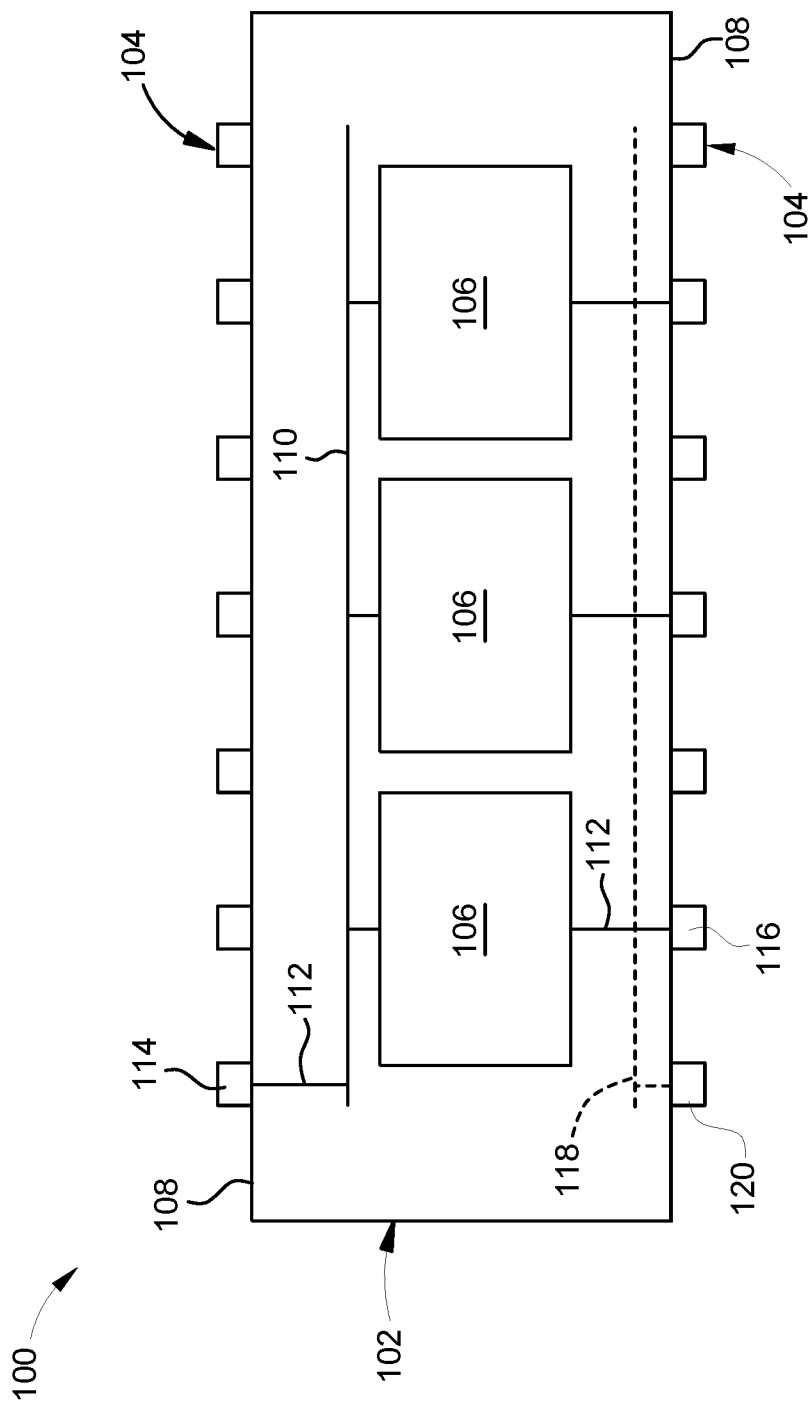
FIG. 1 is a schematic diagram of an integrated circuit (IC) chip with at least one core circuit having SEL detection and mitigation circuitry.

To facilitate understanding, identical reference numerals have been used, where possible, to designate identical elements that are common to the figures. It is contemplated that elements of one example may be beneficially incorporated in other examples. It should be noted that the figures may or may not be drawn to scale and that the figures are only intended to facilitate the description of the features. The figures are not intended as an exhaustive representation of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

DETAILED DESCRIPTION

Examples described herein provide exemplary circuitry and techniques for on-die single event latch-up (SEL) detection and mitigation. In examples describe herein, the circuitry for detection and mitigation of the SEL event is integrated into the circuitry of the die, so mitigation of the SEL event occur locally on the die, thus eliminating the need for remote monitoring and mediation. Moreover in some examples, the circuitry for detection and mitigation of the SEL event is configured to unlatch circuits undergoing the SEL event, while enabling other circuits within the die to remain functional during unlatching. Furthermore, the SEL mitigation circuitry enables unlatching of circuits undergoing the SEL event without interrupting power provided to power supply rails, which assists in maintaining functionality of the die while significantly reducing the time to detect and unlatch circuits.

Turning now to the schematic diagram of FIG. 1, an integrated circuit (IC) chip 100 is illustrated. The IC chip 100 includes a die body 102 having at least one core circuit 106 disposed therein. Although FIG. 1 illustrates three core circuits 106, other numbers of core circuits 106 may be utilized within the die body 102. At least one of the core circuits 106 includes SEL detection and mitigation circuitry. The SEL detection and mitigation circuitry is described in detail further below.

The die body 102 includes a surface 108 on which a plurality of contact pads 104 are exposed. The contact pads 104 are utilized to make power, ground, and signal connections with the core circuits 106 disposed within the IC chip 100. In addition to the SEL detection and mitigation circuitry mentioned above, the core circuits 106 include solid state circuitry for providing the functionality of the IC chip 100. For example, one or more of the core circuits 106 may be configured as memory, logic, MEMS, RF or other IC device. The core circuits 106 may be configured as programmable logic devices, such as field programmable gate arrays (FPGA), memory devices, optical devices, processors or other IC logic structures. Optical devices include photodetectors, lasers, optical sources, and the like.

The core circuits 106 disposed within the die body 102 are coupled to one or more of the contact pads 104 exposed on the surface 108 of the die body 102 by interconnect circuitry 112. The interconnect circuitry 112 generally is formed in an interconnect region of the IC chip 100, and includes one or more conductive lines and vias. The interconnect circuitry 112 includes at least one power rail 110. The power rail 110 is coupled by the interconnect circuitry 112 to a first contact pad 114 (e.g., a reference power supply) of the plurality of contact pads 104 that is configured to be coupled to a power source when in use. The power rail 110 is also coupled by the interconnect circuitry 112 to the core circuits 106.

The interconnect circuitry 112 is also utilized to couple each of the core circuits 106 to a second (e.g., ground) contact pad 114 of the plurality of contact pads 104 that is configured to be coupled to ground when in use. Optionally, the core circuits 106 may be coupled to a ground rail 118 (shown in phantom) that commonly couples the core circuits 106 to a common ground contact pad 120.

As discussed above, at least one of the core circuits 106 includes SEL detection and mitigation circuitry. In some examples, at least two or more or even all of the core circuits include SEL detection and mitigation circuitry. Since the SEL detection and mitigation circuitry of the core circuits 106 is disposed between the power rail 110 and ground (i.e., one of the ground contact pads 116, 120), power to the power rail 110 may be maintained at normal operation voltages while the SEL detection and mitigation circuitry functions to detect and unlatch transistors undergoing SEL events. Furthermore, since power to the power rail 110 is interrupted, SEL events in one core circuit 106 may be detected and mitigated without any effect on the operation of other core circuits 106 disposed within the IC chip 100. Thus, the functionality and reliability of the IC chip 100 is substantially increased over conventional IC chips. Non-limiting examples of the SEL detection and mitigation circuitry are described in detail further below with reference to the schematic diagrams of FIGS. 2-5.

Turning to a first example of the core circuit 106 illustrated in FIG. 2, the core circuit 106 includes a current limiting circuit (CLC) 202, a latch sensing circuit (LSC) 204 and a functional circuit 206. The core circuit 106 may optionally include a timer 208. The CLC 202 is coupled between the power rail 110 and the functional circuit 206. Power from the power rail 110 is provided through the CLC 202 to the functional circuit 206 as further described below. The LSC 204 is coupled between the functional circuit 206 and the CLC 202. The LSC 204 functions to control the CLC 202. The LSC 204 has two states. The LSC 204 functions in a first state when no latches are detected in the functional circuit 206 (i.e., the functional circuit 206 is functioning normally with no latched circuits within the functional circuit 206). The LSC 204 functions in a second state when a latch is detected in the functional circuit 206. The CLC 202 operates to provide a normal amount of current to the functional circuit 206 in response to the LSC 204 being in the first state, and to reduce the amount of current provided to the functional circuit 206 in response to the LSC 204 being in the second state. Advantageously, the CLC 202 and LSC 204 function to sense and mitigate SEL events within the functional circuit 206 without change in the voltage provided to the power rail 110, thus allowing one core circuit 106 to be addressed while other core circuits 106 can operate unimpeded without change in input voltages to those circuits 106.

Describing the functional circuit 206 first in greater detail, the functional circuit 206 includes at least a first functional transistor 252 and a second functional transistor 262. The functional transistors 252, 262 are part of the solid state circuitry and enable the functionality of the IC chip 100. For example, the solid state circuitry of the functional circuit 206 that includes the functional transistors 252, 262 may be configured as memory, logic, MEMS, RF or other IC device. The core circuits 106 may be configured as programmable logic devices, such as field programmable gate arrays (FPGA), memory devices, optical devices, processors or other IC logic structures. Optical devices include photodetectors, lasers, optical sources, and the like.

The first functional transistor 252 is part of a complementary metal-oxide-semiconductor (CMOS) device which includes silicon controlled rectifier (SCR) device 250 (e.g., a PNPN junction) that is susceptible to SEL. Alternative, the first functional transistor 252 may be part of another solid state device that includes a PNPN junction. The second functional transistor 262 may also be part of a CMOS device or other solid state device that includes a PNPN junction. Alternatively, the second functional transistor 262 may be part of another solid state device that does not include a PNPN junction.

The SCR device 250 is coupled between the power rail 110 and the ground contact pad 116 or to the common ground contact pad 120 through the ground rail 118. In the example depicted in FIG. 2, the first functional transistor 252 of the SCR device 250 includes a first terminal 254 and a second terminal 256 (e.g., a source and drain). The first terminal 254 is coupled to the power rail 110 through the LSC 204. The second terminal 256 is coupled, through the LSC 204, to the ground contact pad 116 or to the common ground contact pad 120 through the ground rail 118.

Similarly, the second functional transistor 262 includes a first terminal 264 and a second terminal 266 (e.g., a source and drain). The first terminal 264 is coupled in common with the first terminal 254 of the first functional transistor 252 to the power rail 110 through the CLC 202. The second terminal 266 is coupled in common with the second terminal 256 of the first functional transistor 252, through the LSC 204, to the ground contact pad 116 or to the common ground contact pad 120 through the ground rail 118.

The LSC 204 includes a resistor 214 and a comparator 216. The comparator 216 has a first input terminal 210, a second input terminal 218 and an output terminal 212. The first input terminal 210 of the LSC 204 is coupled to the second terminals 256, 266 of the functional transistors 252, 262. The second input terminal 218 is coupled to a second pad (reference voltage) contact pad 220 that is one of the plurality of contact pads 104. The reference voltage contact pad 220 is utilized to provide a reference voltage to the second input terminal 218 of the comparator 216. The output terminal 212 of the comparator 216 is coupled to the CLC 202. Optionally, the output terminal 212 of the comparator 216 may be coupled to the CLC 202 through the timer 208.

The resistor 214 has a first terminal and a second terminal. The first terminal of the resistor 214 is coupled to the first input terminal 210 of the LSC 204 and to the second terminals 256, 266 of the functional transistors 252, 262. The second terminal of the resistor 214 is coupled to the ground contact pad 116 (or to the common ground contact pad 120 through the ground rail 118, when utilized).

The resistance of the resistor 214 is selected to enable triggering of the LSC 204 during an SEL event to change output states. For example, the functional circuit 206 may be modeled or tested to determine the output current during an SEL event within the functional circuit 206. The resistance value of the resistor 214 is selected to provide a sufficient voltage drop across the resistor 214 that enables good resolution by the comparator 216 of the voltage difference at the first and second input terminals 210, 218 of the comparator 216 in response to the functional circuit 206 experiencing an SEL event. The desired resistance of the resistor 214 may be reduced or increased by selecting an appropriate gain of the comparator 216.

In operation, the first input terminal 210 of LSC 204, coupled between the functional circuit 206 and the resistor 214, receives a "status voltage" that is representative of the voltage across the resistor 214 to ground. The second input terminal 218 of the LSC 204 receives the reference voltage. The comparator 216 of the LSC 204 compares the status voltage to the reference voltage. When one of the functional transistors 252, 262 of the functional circuit 206 are in a latched condition, for example when the SCR device 250 is in a latched state, the amount of current exiting the functional circuit 206 through the resistor 214 to ground via the ground contact pad 116 dramatically increases. Thus, when one or more of the functional transistors 252, 262 of the functional circuit 206 is in a latched condition, a difference between the status voltage and reference voltage read by the comparator 216 exceeds a predetermined amount, causing the comparator 216 to operate in the first state. In the first state, the comparator 216 outputs a first bit, for example a "1", at the output terminal 212. When all of the transistors of the functional circuit 206 not in a latched condition, a difference between the normal status voltage and reference voltage read by the comparator 216 does not exceed the predetermined amount, causing the comparator 216 to operate in the second state. In the second state, the comparator 216 outputs a second bit, for example a "0", at the output terminal 212. The output bit generated by the comparator 216 is provided to the CLC 202.

As discussed above, the timer 208 (e.g., a delay circuit) is disposed between the output terminal 212 of the comparator 216 and the CLC 202. The timer 208 is configured to delay the delivery of the output bit generated by the comparator 216 to the CLC 202. Since the SEL event and mitigation may occur very quickly, for example, in picoseconds, the timer 208 prevents undesired rapid and/or cyclical switching within the CLC 202. Moreover, the output of the timer 208 may be coupled to a status signal contact pad 222 of the plurality of contact pads 104. The output bit of the LSC 204 provided to the status signal contact pad 222 allows communication of the operational state of the functional circuit 206 (i.e., experiencing an SEL event or operating normally) to remote devices outside of the IC chip 100. In examples where the timer 208 is not utilized, the output terminal 212 of the comparator 216 may be coupled directly to the status signal contact pad 222 to provide remote devices with an indication that the functional circuit 206 is experiencing an SEL event or operating normally.

The CLC 202 generally controls the current provided to the functional circuit 206 from the power rail 110. In the example depicted in FIG. 1, two switchable paths are provided in parallel between the functional circuit 206 and the power rail 110. The first path of the CLC 202 includes a first current limiting transistor 232 and a resistor 230 coupled in series between the power rail 110 and the functional circuit 206. In the example depicted in FIG. 1, the resistor 230 is coupled between a first terminal 236 of the first current limiting transistor 232 and the power rail 110. A second terminal 238 of the first current limiting transistor 232 is coupled to the first terminals 236, 242 of the functional transistors 252, 262 of the functional circuit 206. The resistor 230 alternatively may be disposed between the second terminal 238 of the first current limiting transistor 232 and the first terminals 236, 242 of the functional transistors 252, 262 of the functional circuit 206, and the first terminal 236 may be coupled to the power rail 110.

The second path of the CLC 202 includes a second current limiting transistor 234 coupled between the power rail 110 and the functional circuit 206. In the example depicted in FIG. 2, a first terminal 242 of the second current limiting transistor 234 is coupled to the power rail 110, while a second terminal 244 of the second current limiting transistor 234 is coupled to the first terminals 236, 242 of the functional transistors 252, 262 of the functional circuit 206. Thus, power is provided selectively to the SCR device 250 by the two switchable paths of CLC 202.

The current limiting transistors 232, 234 have opposite polarity. In the example provided in FIG. 2, the first current limiting transistor 232 is an N-type transistor, while the second current limiting transistor 234 is a P-type transistor. Gates 240, 246 of the current limiting transistors 232, 234 are both coupled to the output terminal 212 of the comparator 216. Thus since the current limiting transistors 232, 234 are of the opposite polarity, only one of the current limiting transistors 232, 234 will be closed in response to the state of the LSC 204.

For example, when the LSC 204 is in the first state and the output terminal 212 of the comparator 216 provides a first bit, for example "1" in response to the functional circuit 206 experiencing an SEL event, the bit 1 provided to the gate 240 causes the first current limiting transistor 232 to close, allowing current to flow from the power rail 110 through the resistor 230 to the functional circuit 206. The bit 1 simultaneously provided to the gate 246 causing the second current limiting transistor 234 to open, preventing current from flowing from the power rail 110 through the second current path (i.e., defined through the second current limiting transistor 234) to the functional circuit 206.

The resistor 230 has a resistance selected to suppress the voltage provided from the power rail 110 to the functional circuit 206 to a value that is lower than the SEL holding voltage, which unlatches the latched SCR device (for example, SCR device 250 that includes the first functional transistor 252) within the functional circuit 206. The resistance of the resistor 230 is also selected to be greater than the holding voltages of the other functional transistors within the functional circuit 206, such as the second function transistor 262, such that those transistors do not lose functionality while the first functional transistor 252 is unlatched. For example, a resistor 230 having a 70 ohm resistance can suppress an SEL current event in the SCR device 250 to about 0.013 amperes by reducing the voltage provided to the functional circuit 206 to 0.9 volts even through the power rail 110 is maintained at 1.8 volts. This provides two benefits. First within a first core circuit 106, the functionality of the second function transistor 262 of the functional circuit 206 is maintained while the SCR device 250 is unlatched. Secondly, power at the power rail 110 within the IC chip 100 is maintain such SEL mitigation may be performed on a first core circuit 106 while the functionality of a second core circuit 106 of the same chip 100 remains fully functional.

Once the LSC 204 detects that the SEL event has been mitigated, i.e., the SCR device 250 having the first functional transistor 252 has returned to an unlatched state, the LSC 204 switches to the second state and the output terminal 212 of the comparator 216 provides a second bit, for example "0". The bit 0 is provided by the LSC 204 to the gate 240 of the CLC 202 causes the first current limiting transistor 232 to open, preventing current from through from the power rail 110 through the resistor 230 to the functional circuit 206. The bit 0 simultaneously provided to the gate 246 causes the second current limiting transistor 234 to close, thus allowing current from the power rail 110 to pass through the second current path (i.e., defined through the second current limiting transistor 234) to the functional circuit 206. Since the second current path has no in-line resistors, the full voltage of the power rail 110 is effectively provided to the functional circuit 206 for normal operations.

Since the sensing of the latch and unlatched state of the core circuit 106 is performed within the IC chip 100, SEL detection is advantageously rapid. Moreover, since the mitigation of the SEL event occurring within the core circuit 106 is also performed within the IC chip 100, SEL mitigation is advantageously rapid. The rapid detection and mitigation of the SEL event advantageously reduces system down time while protecting the circuits within the IC chip 100 from overheating and other damage.

FIG. 3 depicts another example of a core circuit 106 that may be utilized within the IC chip 100 depicted in FIG. 1. The core circuit 106 of FIG. 3 is the same as the core circuit 106 of FIG. 1, except in that the core circuit 106 of FIG. 3 has a CLC 300.

Similar to the CLC 202, the CLC 300 includes two switchable paths disposed in parallel between the functional circuit 206 and the power rail 110. The first path of the CLC 300 includes a first current limiting transistor 232 and a variable resistor 302 coupled in series between the power rail 110 and the functional circuit 206. In the example depicted in FIG. 3, the variable resistor 302 is coupled between a first terminal 236 of the first current limiting transistor 232 and the power rail 110. A second terminal 238 of the first current limiting transistor 232 is coupled to the first terminals 236, 242 of the functional transistors 252, 262 of the functional circuit 206. The variable resistor 302 alternatively may be disposed between the second terminal 238 of the first current limiting transistor 232 and the first terminals 236, 242 of the functional transistors 252, 262 of the functional circuit 206, and the first terminal 236 may be coupled to the power rail 110. The second path of the CLC 300 includes a second current limiting transistor 234 coupled between the power rail 110 and the functional circuit 206. The CLC 300 switches between the first and second paths in response to the state of the LSC 204 exactly as described above with reference to FIG. 2.

Continuing to refer to the example of FIG. 3, the CLC 300 also includes an amplifier 304 coupled between the variable resistor 302 and the second terminals 256, 266 of the functional transistors 252, 262 of the functional circuit 206. The resistance of the variable resistor 302 is controlled by the output of the amplifier 304. Thus, more severe SEL events that cause higher current flows through the functional circuit 206 cause the amplifier 304 to increase the signal provided to the variable resistor 302, which increases the resistance of the variable resistor 302. The higher the resistance of the variable resistor 302, the lower the voltage provided through the CLC 300 to the functional circuit 206. Thus, small SEL events have less current limiting and lower voltage drops as compared to severe SEL events. Less current limiting advantageously enables the functional circuit 206 to retain greater functionality, and only severe SEL events are responded with greater voltages drops, which may be reduced as the amount of current exiting the functional circuit 206 diminishes as the SCR device 250 returns to an unlatched state.

FIG. 4 depicts another example of a core circuit 106 that may be utilized within the IC chip 100 depicted in FIG. 1. The core circuit 106 of FIG. 4 is the same as the core circuit 106 of FIG. 3, except in that the core circuit 106 of FIG. 4 has a CLC 400 that has a single controllable current path between the functional circuit 206 and the power rail 110.

Similar to the CLC 300, the CLC 400 includes an amplifier 304 coupled between the variable resistor 302 and the second terminals 256, 266 of the functional transistors 252, 262 of the functional circuit 206. The resistance of the variable resistor 302 is controlled by the output of the amplifier 304. The amplifier 304 operates identically as described with reference to FIG. 3.

Continuing to refer to FIG. 4, the controllable current path disposed between the functional circuit 206 and the power rail 110 includes a current limiting transistor 402. The current limiting transistor 402 includes a first terminal 404, as second terminal 406 and a gate 408. The first terminal 404 of the current limiting transistor 402 is coupled to the power rail 110. The second terminal 406 of the current limiting transistor 402 is coupled to the first terminals 236, 242 of the functional transistors 252, 262 of the functional circuit 206. The gate 408 of the current limiting transistor 402 is coupled to the output of the amplifier 304.

The amplifier 304 has an output that is configured to overdrive the current limiting transistor 402 when the LSC 204 is in the first state (i.e., an SEL event of the SCR device 250 is detected) such that the current limiting transistor 402 functions as a resistor. The current limiting transistor 402 is configured to, when overdriven, provide sufficient resistance between the power rail 110 and first terminals 254, 264 of the functional transistors 252, 262 of the functional circuit 206 to sufficiently reduce the voltage provided to the functional circuit 206 to unlatch the SCR device 250 while enabling the second functional transistor 262 to maintain functionality. When the LSC 204 is in the second state (i.e., no SEL event detected), the voltage provided to the current limiting transistor 402 simply keeps the current limiting transistor 402 closed so that the voltage of the power rail 110 is essentially provided to the functional circuit 206 without reduction.

FIG. 5 depicts another example of a core circuit 106 that may be utilized within the IC chip 100 depicted in FIG. 1. The core circuit 106 of FIG. 5 is the same as the core circuit 106 of FIG. 1, except in that the core circuit 106 of FIG. 5 has a CLC 500 that has a single controllable current path between the functional circuit 206 and the power rail 110.

The controllable current path disposed between the functional circuit 206 and the power rail 110 includes a current limiting transistor 502. The current limiting transistor 502 includes a first terminal 504, a second terminal 506, and a gate 508. The first terminal 504 of the current limiting transistor 502 is coupled to the power rail 110. The second terminal 506 of the current limiting transistor 502 is coupled to the first terminals 236, 242 of the functional transistors 252, 262 of the functional circuit 206. The gate 508 of the current limiting transistor 502 is coupled to the output of the LSC 204.

When the LSC 204 is in the first state (i.e., SEL event in the SCR device 250 is detected), the output bit, for example a "1" bit, provided to the current limiting transistor 502 causes the current limiting transistor 502 to open. With the current limiting transistor 502 providing an open circuit between the power rail 110 and first terminals 254, 264 of the functional transistors 252, 262 of the functional circuit 206, the SCR device 250 will quickly unlatch. As soon as the SCR device 250 returns to an unlatched state, the LSC 204 changes to the second state and provides the opposite output bit, e.g., "0" bit, to the gate 508 of the current limiting transistor 502. The "0" bit causes the current limiting transistor 502 to close. The closed current limiting transistor 502 reestablishes the electrical connection between the power rail 110 and first terminals 254, 264 of the functional transistors 252, 262 of the functional circuit 206, such allowing the functional circuit 206 to resume normal operation. As the switching between the open and closed states of the current limiting transistor 502 happens very rapidly, for example, within picoseconds, the functionality of the functional circuit 206 has a minimal interruption. Moreover, as the current limiting transistor 502 effects only one core circuit 106, the other core circuits 106 within the IC chip 100 can function uninterrupted as the voltage to the power rail 110 remains substantially constant during the SEL mitigation cycle.

Figure 6:
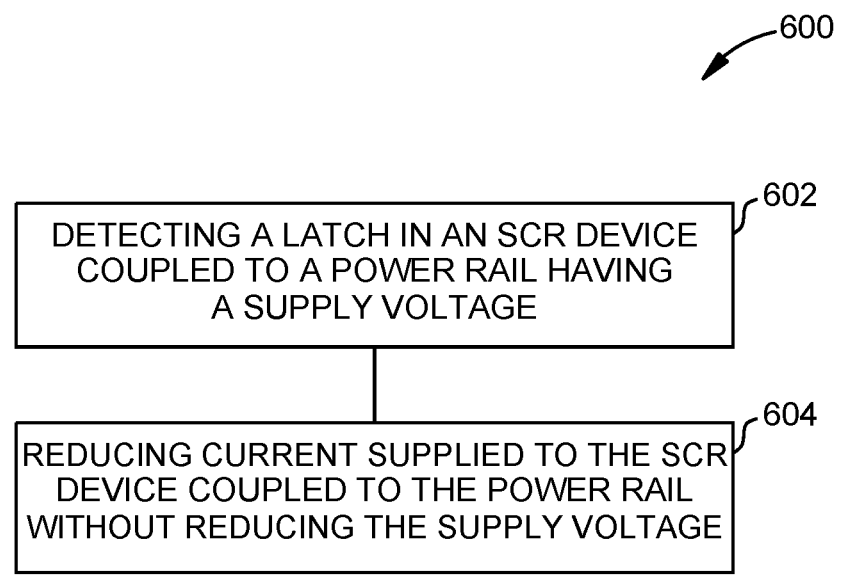
FIG. 6 is a block diagram of a method for on-die detection and mitigation of an SEL event.

FIG. 6 is a block diagram of a method 600 for on-die detection and mitigation of an SEL event. The method begins at operation 602 by detecting a latch state in an SCR device having a first transistor of a functional circuit coupled to a power rail having a supply voltage. The latch state of the SCR device within the functional circuit may be detected using a comparator that compares a reference voltage to a voltage drop across a resistor positioned between the functional circuit and a ground contact pad of the IC chip that contains the functional circuit.

Operation 602 may include providing a signal indicative of the functional status of the functional circuit (i.e., latched or unlatch state of the SCR device within the functional circuit) to a contact pad of the IC chip. The signal may be the "0" or "1" bit provided as an output of by the comparator.

At operation 604, the current supplied to the SCR device of the functional circuit coupled to the power rail is reduced without reducing the supply voltage. In one example, the current is reduced at operation 604 by increasing the resistance between the SCR device of the functional circuit and the power rail. The resistance may be increased by switching between current supply paths having different resistances, changing the resistance of a variable resistor in response to the amount of current exiting the functional circuit, overdriving a transistor disposed in the current path between the power rail and functional circuit, and the like. In another example, the current is reduced at operation 604 by opening the circuit coupling the SCR device of the functional circuit to the power rail.

In one example, the current supplied to the SCR device may be reduced by an amount sufficient to return the SCR device to an unlatched state, wherein the amount of current remains sufficient to maintain operation of a second transistor coupled to the power rail.

In another example, the current supplied to the SCR device may be reduced to an amount sufficient to return the SCR device of the functional circuit in one core circuit of the IC chip to an unlatched state, while other core circuits of the IC chip maintain fully functionality.

Thus, exemplary circuitry and techniques for on-die single event latch-up (SEL) detection and mitigation have been described that enable unlatching of effected circuits while enabling other circuits within the IC chip to maintain functionally. Since the circuitry for detection and mitigation of the SEL event is integrated into the circuitry of the die, mitigation of the SEL events occur locally within the die, thus allowing very rapid restoration of full chip functionality with reduced risk of circuit damage due to overheating.

While the foregoing is directed to specific examples, other and further examples may be devised without departing from the basic scope thereof, and the scope thereof is determined by the claims that follow.

What is claimed is:

1. An integrated circuit (IC) chip, comprising:
   a body having a plurality of contact pads:
   a power rail disposed in the body and coupled to at least one of the plurality of contact pads; and
   a first core circuit disposed in the body, the first core circuit comprising:
      a first current limiting circuit coupled to the power rail;
      a silicon controlled rectifier (SCR) device including a first transistor having a first terminal and a second terminal, the first terminal of the first transistor coupled to the first current limiting circuit;
      a second transistor having a first terminal and a second terminal, the first terminal of the second transistor coupled to the first current limiting circuit; and
      a first latch sensing circuit having a first input terminal coupled to the second terminals of the first and second transistors, the first latch sensing circuit having an output terminal coupled to the first current limiting circuit.

2. The IC chip of claim 1, wherein the first latch sensing circuit further comprises:
   a comparator having a second input terminal configured to receive a reference voltage.

3. The IC chip of claim 2, wherein the first core circuit further comprises:
   a resistor having a first terminal coupled to the first input terminal of the comparator and a second terminal coupled to at least one of the plurality of contact pads that is configured to couple to ground.

4. The IC chip of claim 1, wherein the first current limiting circuit further comprises:
a resistor and a first current limiting transistor coupled in series between the power rail and the first terminal of the first transistor; and
a second current limiting transistor coupled between the power rail and the first terminal of the first transistor, wherein one of the first and second current limiting transistors is an N-type transistor and the other of the first and second current limiting transistors is an P-type transistor.

5. The IC chip of claim 1, wherein the first current limiting circuit further comprises:
a variable resistor and a first current limiting transistor coupled in series between the power rail and the first terminal of the first transistor; and
a second current limiting transistor coupled between the power rail and the first terminal of the first transistor, wherein one of the first and second current limiting transistors is an N-type transistor and the other of the first and second current limiting transistors is an P-type transistor.

6. The IC chip of claim 5, wherein the variable resistor is configured increase in resistance in response to an increase in current at the first terminal of the first transistor.

7. The IC chip of claim 5, wherein the first latch sensing circuit further comprises:
an amplifier having an input terminal coupled to the second terminal of the first transistor and an output terminal coupled to a control terminal of the variable resistor.

8. The IC chip of claim 1, wherein:
the first current limiting circuit further comprises:
a current limiting transistor having a first terminal coupled to the power rail and a second terminal coupled to the first terminal of the first transistor; and
the first latch sensing circuit further comprises:
an amplifier having an output terminal coupled to a gate terminal of the current limiting transistor.

9. The IC chip of claim 8, wherein the first latch sensing circuit further comprises:
a comparator coupled to the second terminals of the first and second transistors, a second input terminal configured to receive a reference voltage, and an output terminal coupled to a first contact pad of the plurality of contact pads.

10. The IC chip of claim 1, wherein the first latch sensing circuit is configured to:
output a first signal in response to the SCR device operating in an unlatched state; and
output a second signal in response to the SCR device operating in a latched state.

11. The IC chip of claim 1, wherein the first current limiting circuit is configured to:
reduce current passing from the power rail to the SCR device in response to a signal being received from the first latch sensing circuit switching from the first signal to the second signal.

12. The IC chip of claim 1 further comprising:
a second core circuit disposed in the body, the second core circuit comprising:
a second current limiting circuit coupled to the power rail;
a second silicon controlled rectifier (SCR) device including third transistor having a first terminal and a second terminal, the first terminal of the third transistor coupled to the second current limiting circuit;
a fourth transistor having a first terminal and a second terminal, the first terminal of the fourth transistor coupled to the second current limiting circuit; and
a second latch sensing circuit having a first input terminal coupled to the first terminals of the third and fourth transistors, the second latch sensing circuit having an output terminal coupled to the second current limiting circuit.

13. The IC chip of claim 1, wherein:
the first current limiting circuit further comprises:
a current limiting transistor having a first terminal coupled to the power rail and a second terminal coupled to the first terminal of the first transistor; and
the first latch sensing circuit further comprises:
a comparator having a second input terminal configured to receive a reference voltage and an output terminal coupled to a gate terminal of the current limiting transistor.

14. An integrated circuit (IC) chip, comprising:
a body having a plurality of contact pads:
a power rail disposed in the body and coupled to at least one of the plurality of contact pads;
a silicon controlled rectifier (SCR) device having a first transistor disposed in the body, the first transistor having a first terminal and a second terminal, the first terminal of the first transistor coupled to the power rail;
a second transistor disposed in the body and having a first terminal and a second terminal, the first terminal of the second transistor coupled to the power rail;
a first latch sensing circuit configured to output a first signal in response to the SCR device operating in an unlatched state, and to output a second signal in response to the SCR device operating in a latched state; and
a first current limiting circuit coupling the first and second transistors to the power rail, the first current limiting circuit configured to reduce current passing from the power rail to the SCR device in response to a signal being received from the first latch sensing circuit switching from the first signal to the second signal.

15. The IC chip of claim 14, wherein the first current limiting circuit is further configured to:
when reducing current, increase a resistance between the power rail and the SCR device and the second transistor.

16. The IC chip of claim 15, wherein the first current limiting circuit further comprises:
a variable resistor disposed between the power rail and the first and second transistors.

17. The IC chip of claim 15, wherein the first current limiting circuit further comprises a transistor having a first terminal coupled to the power rail and a second terminal coupled to the first and second transistors; and
wherein the first latch sensing circuit further comprises an amplifier having an output terminal coupled to a gate terminal of the transistor of the current limiting circuit and an input terminal coupled to the second terminals of the first and second transistors.

18. The IC chip of claim 14, wherein the first current limiting circuit is further configured to:
increase the current passing from the power rail to the SCR device and the second transistor in response to the signal being received from the first latch sensing circuit switching from the second signal to the first signal.

19. A method for operating an integrated circuit chip, the method comprising:
- detecting, by a first latch sensing circuit, a latch state of an SCR device having a first transistor, the SCR device coupled to a power rail having a supply voltage, wherein the integrated circuit comprises:
  - a second transistor having a first terminal and a second terminal, the first terminal of the second transistor coupled to a first current limiting circuit coupled to the power rail; and
  - the first latch sensing circuit having a first input terminal coupled to a terminal of the first transistor and to the second terminal of the second transistor, the first latch sensing circuit having an output terminal coupled to the first current limiting circuit; and
- reducing current supplied to the SCR device coupled to the power rail without reducing the supply voltage.

20. The method of claim 19, wherein reducing current supplied to the SCR device further comprises:
- a) reducing current supplied to the SCR device to an amount sufficient to return the SCR device to an unlatched state, wherein the amount of current is sufficient to maintain operation of a second transistor coupled to the power rail; or
- b) increasing a resistance of a circuit coupling the SCR device to the power rail.

* * * * *